United States Patent [19]
Lim et al.

[11] Patent Number: 5,782,984
[45] Date of Patent: Jul. 21, 1998

[54] METHOD FOR CLEANING AN INTEGRATED CIRCUIT DEVICE USING AN AQUEOUS CLEANING COMPOSITION

[75] Inventors: Kwang-shin Lim, Seoul; Sang-o Park, Kyungki-do, both of Rep. of Korea

[73] Assignee: Samsung Electronics Co., Ltd., Suwon, Rep. of Korea

[21] Appl. No.: 30,339

[22] Filed: Feb. 25, 1998

[30] Foreign Application Priority Data

Mar. 7, 1997 [KR] Rep. of Korea ............... 1997 7774

[51] Int. Cl.$^6$ ............................................. C03C 15/00
[52] U.S. Cl. ............................. 134/2; 134/3; 134/26; 134/28; 134/29; 134/36; 134/41; 134/902; 510/175; 510/176; 510/372; 510/505
[58] Field of Search ................... 134/2, 3, 26, 28, 134/29, 36, 41, 902; 510/175, 176, 372, 505

[56] References Cited

U.S. PATENT DOCUMENTS

| | | | |
|---|---|---|---|
| 3,992,235 | 11/1976 | Garbarini | 156/13 |
| 5,158,100 | 10/1992 | Tanaka et al. | 134/105 |
| 5,250,460 | 10/1993 | Yamagata et al. | 437/62 |
| 5,374,329 | 12/1994 | Miyawaki | 156/630 |
| 5,670,411 | 9/1997 | Yonehara et al. | 437/62 |
| 5,705,089 | 1/1998 | Sugihara et al. | 252/79.1 |
| 5,713,838 | 2/1998 | Yarborough | 433/215 |

*Primary Examiner*—Jill Warden
*Assistant Examiner*—Sharidan Carrillo
*Attorney, Agent, or Firm*—Myers, Bigel, Sibley & Sajovec, PA

[57] ABSTRACT

A method for cleaning an integrated circuit substrate comprises cleaning the integrated circuit substrate by contacting the integrated circuit substrate with an aqueous cleaning composition. The aqueous cleaning composition comprises from about 0.1 to about 2 percent of hydrogen fluoride based on the volume of the composition, from about 9 to about 15 percent of hydrogen peroxide based on the volume of the composition, and from about 41 to about 47 percent of a $C_1$ to $C_6$ alcohol based on the volume of the composition.

9 Claims, No Drawings

METHOD FOR CLEANING AN INTEGRATED CIRCUIT DEVICE USING AN AQUEOUS CLEANING COMPOSITION

FIELD OF THE INVENTION

The invention generally relates to microelectronic device manufacturing methods, and more particularly to methods of manufacturing semiconductor substrates.

BACKGROUND OF THE INVENTION

Injection of impurities into microelectronic (e.g., semiconductor) devices is often significant since it typically impacts a number of factors relating to the electrical function of the device, production yield, quality, and the like. Subsequent to impurity injection, the formation of device elements typically involves the use of deposited films or insulating films in connection with circuit distribution. In general, the manufacture of microelectronic devices often involves a number of steps including photolithographic process steps for transferring a mask having a predetermined pattern onto a wafer surface, oxidation process steps, impurity doping process steps, metallization process steps, and related process steps.

As a result of these processes, contaminants often accumulate on the devices. As an example, the devices may be sensitive to extremely low levels of contaminants such as those present on the order of 12 parts per million. Additionally, patterns in the devices may be adversely effected by the contaminants, such as those which are 12 micrometers or less in diameter. Thus close monitoring of the processes involved in manufacturing the devices may be desirable.

Wafer cleaning processes typically serve an important role in controlling contaminant levels in microelectronic devices. Device cleaning is often required after various individual processes are carried out such as, for example, oxidation, photolithography, diffusion, ion injection, epitaxial film formation using a CVD (Chemical Vapor Deposition) method, metallic processes, and the like. Conventional cleaning processes typically fall into two categories: chemical methods and physical methods. Chemical methods usually encompass using deionized water, acid or alkali etching, oxidation/reduction using corresponding agents, plasma carbonization of organic material, decomposition using organic cleaners, and the like. Physical methods typically encompass utilizing organic cleaners or ultrasonic waves on the wafers, grinding the wafers to attempt to remove particles which may be present on the wafers, brushing the wafers to potentially remove any deposited particles, and spraying the wafers with a high pressure medium such as deionized water, gas, or the like. These techniques are known to one who is skilled in the art.

A common method used in cleaning of microelectronic devices typically involves removing impurities on a wafer surface using a standard cleaning solution, rinsing the wafer using deionized water, contacting the wafer surface with a dilute hydrogen fluoride solution to remove oxidation films and metallic contaminants, rerinsing the wafer using deionized water, and finally spin drying the wafer. A standard solution usually contains a mixture of ammonium hydroxide, hydrogen peroxide, and deionized water which is intended to clean and remove: (1) inorganic contaminants such as dust, (2) organic components, and (3) thin oxidized films which may be present on the wafer surface. Other contaminants such as metallic contaminants can be removed from the wafer surface using dilute hydrogen fluoride.

The above cleaning method suffers from potential drawbacks. Specifically, it may be difficult to completely remove contaminants of elements having high oxidation numbers, such as copper for example, along with organic contaminants by only using the cleaning solution by itself. Moreover, erosion of the wafer surface may occur as a result of this cleaning method, with the surface having an undesirable μ-roughness.

There is a need in the art for cleaning compositions and methods of using the same which potentially remove organic contaminants, along with metallic contaminants having a higher oxidation-reduction potential than hydrogen. It would be particularly desirable if the cleaning compositions resulted in minimal wafer surface erosion when contacted by the compositions. These contaminants include certain contaminants more efficiently than current methods.

SUMMARY OF THE INVENTION

The invention provides aqueous compositions for cleaning integrated circuit substrates. The compositions comprise from about 0.1 to about 2 percent of hydrogen fluoride based on the volumes of the compositions, from about 5 to about 15 percent of hydrogen peroxide based on the volumes of the compositions, and from about 41 to about 47 percent of $C_1$ to $C_6$ alcohols based on the volumes of the compositions.

The invention also provides methods for cleaning integrated circuit substrates used in microelectronic devices. The methods comprise contacting the substrates with the aqueous compositions of the invention.

The invention is potentially advantageous in that it may offer more efficient cleaning of wafer surfaces relative to conventional cleaning techniques. In addition, the wafer surfaces may experience less corrosion in comparison to the conventional techniques.

DETAILED DESCRIPTION OF THE PREFERRED EMBODIMENTS

The present invention now will be described more fully hereinafter with reference to the preferred embodiments of the invention. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In one aspect, the invention relates to aqueous compositions for cleaning integrated circuit substrates (e.g., wafers). The aqueous compositions comprise from about 0.1 to about 2 percent of hydrogen fluoride based on the volumes of the compositions, from about 5 to about 15 percent of hydrogen peroxide based on the volumes of the compositions, and from about 41 to about 47 percent of $C_1$ to $C_6$ alcohols based on the volumes of the compositions. Preferably, the aqueous compositions comprise about 1 percent by volume of hydrogen fluoride, about 9 percent by volume of hydrogen peroxide, and about 45 percent by volume of the $C_1$ to $C_6$ alcohols.

In forming the aqueous compositions of the invention, it is preferred to employ solutions which are 49 weight percent concentration hydrogen fluoride since they are believed to widely available commercially. Although not being bound to any theory, it is believed that the hydrogen fluoride potentially functions to remove oxidized materials on the wafer surfaces, reduce the adhesion of impurities thereon, and improve wafer surface passivation. It is also preferred to employ solutions containing 31 weight percent concentration hydrogen peroxide solutions to potentially maximize the removal efficiency of metals such as copper. Although not intending to be bound by any one theory, the oxidizing power of the hydrogen peroxide may be attributable to the presence of nascent oxygen which is typically generated after the decomposition of the hydrogen peroxide.

A number of different types of $C_1$ to $C_6$ alcohols may be used in the aqueous compositions. Examples of these alcohols include, but are not limited to, methanol, ethanol, butanol, pentanol, isopropyl alcohol, hexanol, and mixtures thereof. Although not intending to be bound by any theory, it is believed that the low-grade alcohols function to decrease the density of impurity particles and also reduce the free energies of the wafer surfaces. Preferably, the $C_1$ to $C_6$ alcohol is isopropyl alcohol. The $C_1$ to $C_6$ alcohols may be present in equal weight amounts relative to the amount of water present in the solutions.

The aqueous compositions are preferably made by first mixing deionized water and alcohols together. Hydrogen peroxide and hydrogen fluoride are then successively added to these mixtures. It is believed that this mixing order yields compositions with potentially favorable cleaning efficiencies.

In a second aspect, the invention relates to methods for cleaning integrated circuit substrates (e.g., wafers). The methods comprise contacting the integrated circuit substrates with the aqueous compositions of the invention. The methods may include other steps. For example, prior to contacting the integrated circuit substrates with the aqueous compositions of the invention, the substrates may be contacted with cleaning solutions such as, for example, conventional cleaning solutions. The substrates can be subsequently contacted with water. After the substrates are cleaned with the aqueous compositions of the invention, the substrates may be rinsed with water.

The steps of contacting the wafers with the aqueous compositions can be performed under various conditions. It is preferred that the wafers be contacted at temperatures ranging from about 10° C. to about 40° C. If the contacting step is conducted at temperatures less than 10° C., a decrease in cleaning efficiency may be experienced. If the contacting step is conducted at temperatures greater than 40° C., the hydrogen fluoride may vaporize and hydrogen peroxide could decompose. More preferably, the contacting step is carried out at room temperature. Additionally, the wafers may be contacted with the aqueous compositions from about 1 to about 20 minutes, more preferably from about 3 to about 10 minutes. If the contacting step is conducted for less than 1 minute or greater than 20 minutes, the cleaning efficiency may decrease.

The following examples are for illustrative purposes only, and are not intended to limit the invention to the embodiments set forth therein.

EXAMPLE 1

A cleaning composition was prepared by mixing a solution containing 49 weight percent concentration hydrogen fluoride, a solution containing 31 weight percent concentration hydrogen peroxide, isopropyl alcohol, and deionized water. The resulting solution had a composition of 1 volume percent of hydrogen fluoride, 9 volume percent of hydrogen peroxide, 45 volume percent of isopropyl alcohol, and 45 volume percent of deionized water. The composition was formed by sequentially adding the isopropyl alcohol, the hydrogen peroxide, and the hydrogen fluoride to the deionized water.

EXAMPLE 2

A wafer was cleaned at 70° C. for 10 minutes with a conventional cleaning solution. The wafer was subsequently rinsed and then cleaned with the composition set forth in Example 1 at room temperature for 5 minutes. The wafer was thereafter rinsed with deionized water and dried with a conventional spin dryer. Subsequently, the cleaning efficiency of the techniques, the μ-roughness of the wafers after cleaning, and the life time of the insulating films of the wafer were determined with the results presented in Tables 1, 2, and 3 respectively. Specifically, the cleaning efficiency was determined by detecting the number of contaminant particles on the wafer and subsequent to cleaning. The particle difference was determined using a Scanning Electron Microscope. The μ-roughness was determined by evaluating the planeness of the wafer using an Atomic Focus Microscope (AFM) supplied by the Digital Instrument Company located in the U.S.A. The results of the μ-roughness were expressed as Root Mean Square (RMS) values and shape uniformity. The life time was determined by measuring the time required for current to flow upon breakdown of the insulating film when an external voltage was applied. As a result, the electrical properties of the impurity-contaminated insulating film were determined.

In general, it was observed that the life time may be inversely proportional to the level of contamination of the insulating film.

EXAMPLE 3

A procedure similar to Example 2 was carried out except that the wafer was cleaned with a composition comprising 200 volume percent of deionized water and 1 volume percent of hydrogen peroxide. The cleaning was carried out at room temperature for 90 seconds. The cleaning efficiency of the wafer surface, the μ-roughness, and the life time of the insulating film thereof were detected after a second cleaning step and a spin drying step performed in succession. These values are set forth in Tables 1, 2, and 3.

TABLE 1

Particles Present on Wafer Surfaces Subsequent to Cleaning

| | WAFER SURFACE | |
|---|---|---|
| | $Si_3H_4$ (%) | Si (%) |
| Example 2 | 60.07 | 52.48 |
| Example 3 | 92.61 | 84.11 |

TABLE 2

μ-Roughness Subsequent to Cleaning

| | Analysis element | |
|---|---|---|
| | RMS | Shape uniformity |
| Example 2 | 5.80 | 11.42 |
| Example 3 | 3.00 | 5.83 |

TABLE 3

| | Life Times of Insulating Films | |
|---|---|---|
| | Analysis element | |
| | Bare wafer (μ sec) | wafer after clean (μsec) |
| Example 2 | 106.4 | 101.8 |
| Example 3 | 108.3 | 104.3 |

Life Times of Insulating Films

As illustrated in Table 1, the efficiency of a wafer cleaning according to the invention described in Example 2 is greater than the efficiency according to a conventional cleaning described in Example 3. Moreover, the cleaning efficiency with respect to an insulating film containing a nitride material may be higher relative to insulating films formed from other materials.

Referring to Table 2, the wafer cleaned by a solution of the invention displays a higher planeness than a wafer cleaned using the dilute hydrogen peroxide solution described in Example 3. Moreover, a wafer cleaned by a solution of the invention is less corroded than a wafer cleaned using a conventional cleaning solution.

Referring to Table 3, the life times of insulating films are set forth before and after using: (1) the cleaning solution described in Example 2 and (2) the cleaning solution described in Example 3. In general, the insulating film which has the least amount of contamination typically has a longer life time as defined herein. Thus as shown in Table 3, the life time of the insulating film cleaned in accordance with the invention is longer than a conventionally cleaned insulating film. Thus, the cleaning efficiency according to the invention is greater than the conventional cleaning solution.

The invention is potentially advantageous in that it may offer more efficient cleaning of wafer surfaces relative to prior art cleaning techniques. In addition, the wafer surfaces may experience less corrosion in comparison to the conventional techniques.

In the specification and examples, there have been disclosed typical preferred embodiments of the invention and, although specific terms are employed, they are used in a generic and descriptive sense only and not for the purposes of limitation, the scope of the invention being set forth in the following claims.

That which is claimed:

1. A method for cleaning an integrated circuit substrate, said method comprising:

cleaning the integrated circuit substrate by contacting the integrated circuit substrate with an aqueous composition comprising from about 0.1 to about 2 percent of hydrogen fluoride based on the volume of the composition, from about 9 to about 15 percent of hydrogen peroxide based on the volume of the composition, and from about 41 to about 47 percent of a $C_1$ to $C_6$ alcohol based on the volume of the composition.

2. A method according to claim 1, wherein the aqueous composition comprises about 1 percent by volume of the hydrogen fluoride.

3. A method according to claim 1, wherein the aqueous composition comprises about 9 percent by volume of the hydrogen peroxide.

4. A method according to claim 1, wherein the aqueous solution comprises about 45 percent by volume of the $C_1$ to $C_6$ alcohol.

5. A method according to claim 1, wherein the $C_1$ to $C_6$ alcohol is selected from the group consisting of methanol, ethanol, butanol, pentanol, hexanol, and mixtures thereof.

6. A method according to claim 1, wherein the $C_1$ to $C_6$ alcohol is isopropyl alcohol.

7. A method according to claim 1, wherein said cleaning comprises contacting the integrated circuit substrate with the aqueous cleaning composition at a temperature from about 10° C. to about 40° C.

8. A method according to claim 1, wherein said cleaning comprises contacting the integrated circuit substrate with the aqueous cleaning composition from about 1 to about 20 minutes.

9. A method according to claim 1, wherein said cleaning comprises contacting the integrated circuit substrate with the aqueous cleaning composition from about 3 to about 10 minutes.

* * * * *